(12) United States Patent
Burkett et al.

(10) Patent No.: US 12,219,730 B2
(45) Date of Patent: Feb. 4, 2025

(54) DEFLECTOR AND METHOD FOR REDUCING ENTRY OF DUST AND/OR FLUID INTO AN ENCLOSURE

(71) Applicant: CORNING RESEARCH & DEVELOPMENT CORPORATION, Corning, NY (US)

(72) Inventors: Alan Duncan Burkett, Bedford, TX (US); William Julius McPhil Giraud, Azle, TX (US); Charles Todd Henke, Boyd, TX (US); Selvam Packiarajan, Frisco, TX (US)

(73) Assignee: Corning Research & Development Corporation, Corning, NY (US)

( * ) Notice: Subject to any disclaimer, the term of this patent is extended or adjusted under 35 U.S.C. 154(b) by 341 days.

(21) Appl. No.: 17/676,285

(22) Filed: Feb. 21, 2022

(65) Prior Publication Data
US 2022/0170316 A1   Jun. 2, 2022

(51) Int. Cl.
  *H05K 7/18*  (2006.01)
  *G02B 6/44*  (2006.01)
(52) U.S. Cl.
  CPC .......... *H05K 7/186* (2013.01); *G02B 6/4446* (2013.01); *G02B 6/44465* (2023.05)
(58) Field of Classification Search
  CPC .......... H05K 7/20145; H05K 7/20181; H05K 7/20536; H05K 7/20709; H05K 7/186;
  (Continued)

(56) References Cited

U.S. PATENT DOCUMENTS 3,363,953 A * 1/1968 Lacan ............... H05K 5/03
 312/100
3,912,348 A * 10/1975 Seymour ............ E06B 7/26
 49/476.1
(Continued)

FOREIGN PATENT DOCUMENTS

CN   107800044 A      3/2018
CN   111315167 A *    6/2020 ............. F24F 1/22
(Continued)

OTHER PUBLICATIONS

Translation CN107800044A, 3 pages (Year: 2018).*
(Continued)

*Primary Examiner* — Andrew Roersma

(57) ABSTRACT

A deflector may be configured to reduce entry of at least one of dust or fluid into an enclosure configured to enclose in an interior thereof a plurality of optical communication connections. The deflector may include a first leg defining a first intersection edge and a first remote edge. The first leg may define a first hole adjacent the first end of the first leg and a second hole adjacent the second end of the first leg. The deflector may also include a second leg defining a second intersection edge and a second remote edge. The first intersection edge and the second intersection edge may be coupled to one another to define a deflector angle. The first hole may be configured to receive a first mounting stud associated with the enclosure, and the second hole may be configured to receive a second mounting stud associated with the enclosure.

20 Claims, 12 Drawing Sheets

(58) Field of Classification Search
CPC .. H05K 5/0214; H05K 5/0213; H05K 5/0217; H05K 5/02; G02B 6/44465; G02B 6/44524; G02B 6/4446; H02B 1/28
See application file for complete search history.

(56) References Cited

U.S. PATENT DOCUMENTS

| | | | |
|---|---|---|---|
| 5,747,734 A | 5/1998 | Kozlowski et al. | |
| 5,775,051 A | 7/1998 | Nicolai et al. | |
| 5,971,511 A * | 10/1999 | Diebel | H02B 1/38 |
| | | | 312/265.5 |
| 6,241,331 B1 * | 6/2001 | Kammerl | H02B 1/28 |
| | | | 312/265.5 |
| 6,879,483 B2 * | 4/2005 | Johnson | H02B 1/28 |
| | | | 312/265.5 |
| 7,178,354 B2 * | 2/2007 | Bretschneider | H05K 7/20609 |
| | | | 62/262 |
| 7,782,597 B2 * | 8/2010 | Chiu | H05K 5/0213 |
| | | | 361/679.01 |
| 10,772,226 B2 * | 9/2020 | Zhou | B01D 46/0043 |
| 10,819,088 B2 * | 10/2020 | Janish | H02B 1/06 |
| 10,947,773 B2 * | 3/2021 | Reese | E06B 7/22 |
| 2002/0063498 A1 * | 5/2002 | Blake | H02B 1/50 |
| | | | 312/100 |
| 2005/0174020 A1 * | 8/2005 | Francisquini | H02B 1/01 |
| | | | 312/265.3 |
| 2012/0298330 A1 * | 11/2012 | Mysse, III | H05K 5/0213 |
| | | | 165/96 |
| 2013/0020329 A1 * | 1/2013 | Lin | H05K 7/20572 |
| | | | 220/367.1 |
| 2013/0320831 A1 * | 12/2013 | Schmidt | H02B 13/025 |
| | | | 49/495.1 |
| 2014/0014389 A1 * | 1/2014 | Moore | H01R 29/00 |
| | | | 174/58 |
| 2016/0105981 A1 * | 4/2016 | Harris | G06F 12/0804 |
| | | | 312/293.3 |
| 2021/0195773 A1 * | 6/2021 | Zhang | H05K 5/0213 |

FOREIGN PATENT DOCUMENTS

| | | | | |
|---|---|---|---|---|
| DE | 4205479 C1 * | 5/1993 | | H02B 1/28 |
| DE | 102011080376 A1 * | 2/2013 | | H02B 1/28 |
| WO | 2021/050049 A1 | 3/2021 | | |

OTHER PUBLICATIONS

International Search Report and Written Opinion of the International Searching Authority; PCT/US2019/050388; dated Jul. 13, 2020; 17 pages; European Patent Office.

* cited by examiner

DEFLECTOR AND METHOD FOR REDUCING ENTRY OF DUST AND/OR FLUID INTO AN ENCLOSURE

PRIORITY APPLICATION

This application claims the benefit of priority of International Application No. PCT/US19/50388, filed on Sep. 10, 2019, the content of which is relied upon and incorporated herein by reference in its entirety.

TECHNICAL FIELD

This disclosure relates to deflectors and methods for reducing entry of dust and/or fluid into an enclosure, and more particularly, to deflectors and methods for reducing entry of dust and/or fluid into an enclosure configured to enclose in an interior thereof a plurality of optical communication connections.

BACKGROUND

Cabinets may be used to enclose and protect equipment, such as, for example, fiber optic equipment associated with fiber optic cables including optical fibers. For example, fiber optic equipment may be enclosed in cabinets and provide connections and circuitry for facilitating broadband voice, video, and data transmission. One example of a cabinet for enclosing fiber optic equipment is a fiber optic distribution cabinet, some of which may be intended to be installed in an outdoor environment exposed to the elements. As a result, it may often be desirable to prevent entry of weather- and/or environmentally-related substances into the interior of the enclosure. The construction of some cabinets may suffer from a number of possible drawbacks. For example, the exterior of some cabinets is constructed as a single piece, thus rendering such cabinets difficult to repair if damaged and difficult to modify in order to, for example, expand the capacity of the cabinet without replacing large portions of the cabinet, or even the entire cabinet.

Some examples described herein may address one or more of these possible drawbacks.

SUMMARY

The present disclosure is generally directed to a deflector configured to reduce entry of at least one of dust or fluid into an enclosure configured to enclose in an interior thereof a plurality of optical communication connections. The deflector may define a longitudinal axis extending between a first end of the deflector and a second end of the deflector opposite the first end. The deflector may include an elongated first leg defining a first intersection edge and a first remote edge opposite the first intersection edge. The first leg may define a first hole adjacent the first end of the first leg and a second hole adjacent the second end of the first leg. The deflector may also include an elongated second leg defining a second intersection edge and a second remote edge opposite the second intersection edge. The first intersection edge and the second intersection edge may be coupled to one another to define a deflector angle. The first hole may be configured to receive a first mounting stud associated with the enclosure, and the second hole may be configured to receive a second mounting stud associated with the enclosure.

The present disclosure is also generally directed to an enclosure configured to enclose in an interior thereof a plurality of optical communication connections. The enclosure may include an upper panel coupled to the enclosure and including a panel section and an upper flange extending orthogonal with respect to the panel section. The enclosure may also include an upper frame member configured to at least partially support the upper panel, the upper frame member defining a longitudinal axis extending between opposite ends of the upper frame member. The enclosure may further include a deflector configured to reduce entry of at least one of dust or fluid into the interior of the enclosure. The deflector may define a longitudinal axis extending between a first end of the deflector and a second end of the deflector opposite the first end. The deflector may include an elongated first leg coupled to the upper frame member and defining a first intersection edge and a first remote edge opposite the first intersection edge. The deflector may further include an elongated second leg defining a second intersection edge and a second remote edge opposite the second intersection edge. The first intersection edge and the second intersection edge may be coupled to one another to define a deflector angle.

The present disclosure is also generally directed to an enclosure configured to enclose in an interior thereof a plurality of optical communication connections. The enclosure may include a first vertical portion and a second vertical portion spaced from the first vertical portion. The first vertical portion and the second vertical portion may partially define an opening of the enclosure. The second vertical portion may include a vertical face facing outward relative to the enclosure. The enclosure may also include a door including a first vertical edge coupled to the first vertical portion of the enclosure, such that the door pivots relative to the first vertical edge. The enclosure may further include a second vertical edge opposite the first vertical edge. The first vertical edge may be coupled to the first vertical portion of the enclosure, such that the second vertical edge of the door moves between a first position abutting the vertical face of the second vertical portion of the enclosure to a second position spaced from the vertical face. The enclosure may further include a deflector configured to reduce entry of at least one of dust or fluid into the interior of the enclosure. The deflector may define a longitudinal axis extending between a first end of the deflector and a second end of deflector opposite the first end. The deflector may include an elongated first leg coupled to the vertical face of the enclosure and defining a first intersection edge and a first remote edge opposite the first intersection edge. The deflector may also include an elongated second leg defining a second intersection edge and a second remote edge opposite the second intersection edge. The first intersection edge and the second intersection edge may be coupled to one another to define a deflector angle. The deflector may further include a flange extending from the remote edge of the second leg in a direction substantially parallel to the first leg.

The present disclosure is also generally directed to a method for reducing entry of at least one of dust or fluid into an enclosure configured to enclose in an interior thereof a plurality of optical communication connections. The enclosure may include an upper frame member, a lower frame member, a vertical frame member extending between the lower frame member and the upper frame member, an upper panel coupled to the upper frame member, and a door coupled to the enclosure and configured to pivot between a closed position and an open position. The method may include coupling a deflector to one of the upper frame member, the lower frame member, the upper panel, or a vertical edge of the door. The deflector may include an elongated first leg defining a first intersection edge and a first remote edge opposite the first intersection edge. The first leg may define a first hole adjacent the first end of the first leg and a second hole adjacent the second end of the first leg. The deflector may also include an elongated second leg defining a second intersection edge and a second remote edge opposite the second intersection edge. The first intersection edge and the second intersection edge may be coupled to one another to define a deflector angle. The first leg of the deflector may be configured and coupled to the one of the upper frame member, the lower frame member, the upper panel, or the vertical edge of the door, such that at least one or more dust or fluid is substantially prevented from entering the interior of the enclosure.

DETAILED DESCRIPTION

Figure 1:
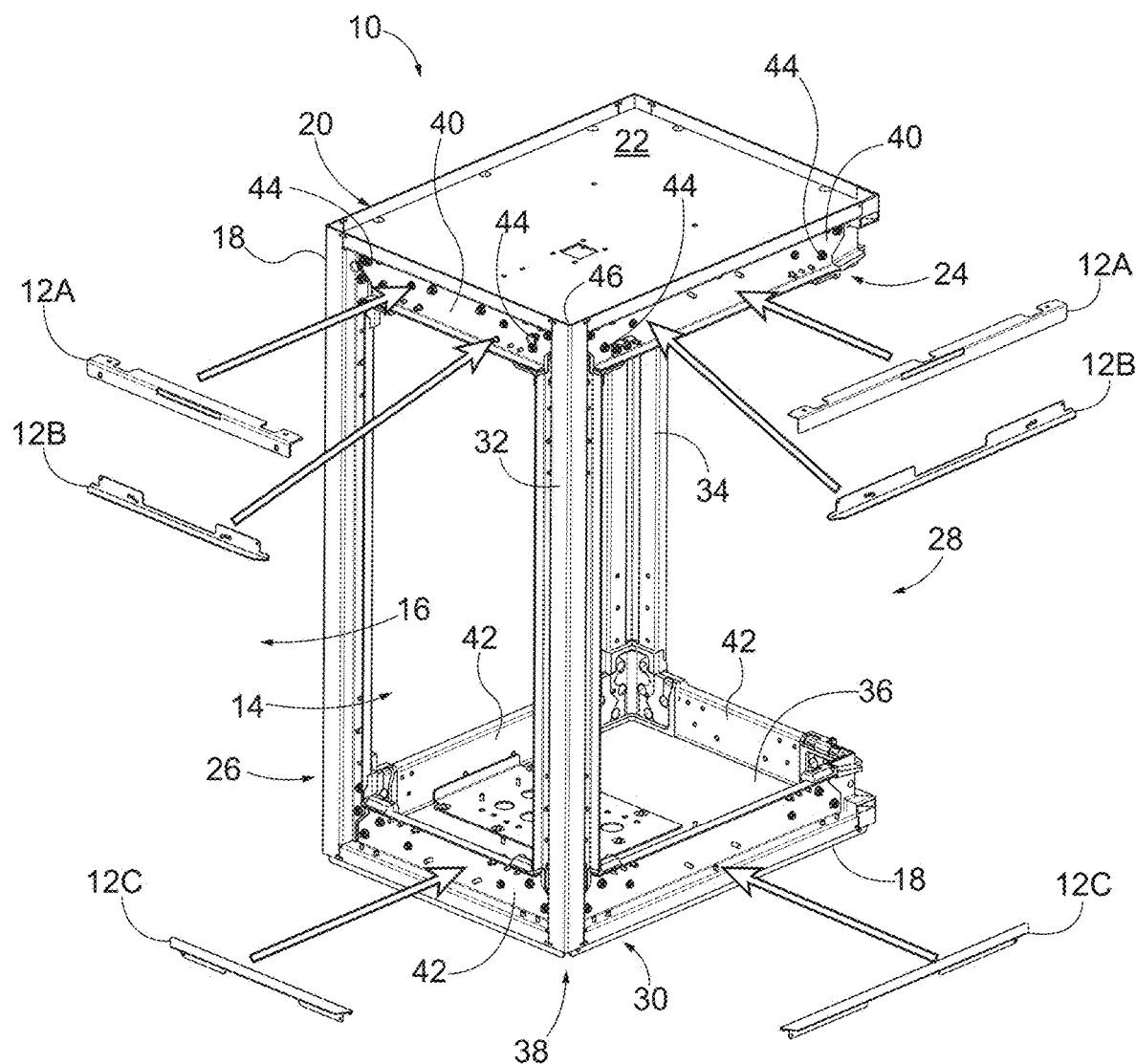
FIG. 1 is a schematic perspective view of an example partial enclosure including example deflectors for reducing entry of dust and/or fluid into the enclosure.

Reference will now be made in detail to embodiments, examples of which are illustrated in the accompanying drawings. Whenever possible, the same reference numbers are used throughout the drawings to refer to the same or like parts. Although structures described herein are sometimes, for clarity of explanation, described including terminology related to example upper, lower, lateral, vertical, and/or horizontal orientations and/or relationships, which may imply absolute relative orientations and/or relationships, such descriptions should not be interpreted in a manner to necessarily require absolute orientations and/or relationships, but rather, they should be interpreted in manner consistent with relative orientations and/or relationships.

This disclosure is generally directed to deflectors and methods for reducing entry of dust and/or fluid into an enclosure, and more particularly, to deflectors and methods for reducing entry of dust and/or fluid into an enclosure configured to enclose in an interior thereof a plurality of optical communication connections. According to some examples, the enclosures described herein may be assembled on site and may be scalable to meet the capacity requirements of the equipment being enclosed by the enclosure. For example, some examples of the enclosure may be formed by a frame assembled from frame members coupled to one another, for example, by brackets. The frame members may be provided (or modified on-site) to build a frame (e.g., off-site or on-site) defining the desired interior dimensions. Thereafter after, or prior, panels may be attached to the frame to create the enclosure. In some examples, one or more of the panels may be pivotally coupled to the frame to provide one or more doors configured to pivot between open and closed positions. In some examples, equipment to be enclosed in the enclosure may be assembled and/or coupled to the interior of the enclosure during and/or after completion of assembly of the enclosure.

In some examples, one or more deflectors may be coupled to the enclosure and may be configured to reduce or prevent entry of dust and/or fluid into the interior of the enclosure. For example, one or more deflectors may be coupled to one or more frame members of the enclosure and/or one or more panels of the enclosure, for example, one or more doors of the enclosure. In some examples, the deflectors may be configured to channel dust and/or fluid away from potential entry points into the interior of the enclosure. In some examples, the deflectors and/or methods described herein may result in improving the dust- and/or fluid-resistance of the enclosure. In some examples, the deflectors and/or methods described herein may result in improving the dust- and/or fluid-resistance of the enclosure, for example, such that an enclosure meeting a relatively lower standard for dust- and/or fluid-resistance may be improved to meet a relatively more-strict standard for dust- and/or fluid resistance. For example, an enclosure configured to meet standards for dust- and/or fluid-resistance associated with indoor use may be modified, for example, by coupling one or more deflectors to the enclosure, such that the modified enclosure may meet standards for dust- and/or fluid-resistance associated with outdoor use. In some examples, the deflectors and methods described herein may result improving the dust- and/or fluid-resistance of an existing enclosure, for example, by adding one or more deflectors to an existing enclosure and thereby improving the dust- and/or fluid-resistance of the resulting, modified enclosure. In an example embodiment, the enclosure may have an Ingress Protection (IP) rating of IP 55. Installation of the deflectors may increase the IP rating to IP 65 and/or enable the enclosure to meet or exceed the GR-3125 requirements, sometimes referred to as the "Wind Driven Rain test." The deflectors may form a torturous path for water, dust, or other debris, thereby reducing the accumulation of water, dust, or other debris at, or near, sealing surfaces of the enclosure.

FIG. 1 is a schematic perspective view of an example partial enclosure 10 including example deflectors 12A-12C for reducing entry of dust and/or fluid into the enclosure 10. The partial enclosure 10 shown in FIG. 1 is depicted without side panels or one or more doors. The example enclosure 10 shown in FIG. 1 may be a cabinet for enclosing fiber optic equipment, such as fiber optic cables including optical fibers, and connections and circuitry for facilitating broadband voice, video, and data transmission. In some examples, the enclosure 10 may be a fiber optic distribution indoor cabinet and/or outdoor cabinet, which may be intended to be installed in an indoor environment and/or in an outdoor environment exposed to the elements. Other types of enclosures for enclosing other types of equipment are contemplated.

As shown in FIG. 1, the example enclosure 10 defines an interior 14 and an exterior 16. The interior 14 may be configured to contain various structures known to those skilled in the art for facilitating routing and/or connection of fiber optic cables including optical fibers. The example enclosure 10 shown includes a frame 18 configured to be coupled to and/or support a plurality of panels (e.g., exterior panels) secured to the frame 18 for enclosing the interior 14 of the enclosure 10. For example, when assembled, in some examples, the enclosure 10 may include a back panel coupled to a back side 20 of the frame 18, a top panel 22 coupled to a top side 24 of the frame 18, a first side panel coupled to a first side 26 of the frame 18, a second side panel coupled to a second side 28 of the frame 18 opposite the first side panel, and a door panel coupled to a front side 30 of the frame 18, such that it pivots with respect to the frame 18, for example, as described herein. In some example, one or more of the back panel, the first side panel, or the second side panel, may be replaced by or include one or more door panels. For example, a second door panel may be coupled to the second side 28 of the frame 18. In some such examples, a first door panel may be coupled to the front side 30 of the frame 18, for example, via a first vertical frame member 32, such that it pivots relative to the first vertical frame member 32, and/or the second door panel may be coupled to the second side 28 of the frame 18, for example, via a second vertical frame member 34 (e.g., located diagonally across the footprint of the frame 18 relative to the first vertical frame member 32), such that the second door panel pivots relative to the second vertical frame member 34. In some examples, the enclosure 10 also includes a bottom panel 36 coupled to a bottom side 38 of the frame 18. Other configurations of enclosure, frame, frame members, panels, and/or door panels are contemplated.

In the example partial enclosure 10 shown in FIG. 1, the example frame 18 includes four upper horizontal frame members 40 at least partially forming the top side 24 of the frame 18, and four lower horizontal frame members 42 at least partially forming the bottom side 38 of the frame 18. As shown in FIG. 1, the partial enclosure 10 may be provided with one or more top panel deflectors 12A, for example, at an interface between the top panel 22 and one or more of the upper horizontal frame members 40. For example, a top panel deflector 12A may be coupled to one or more of the upper horizontal frame members 40 (e.g., each of the upper horizontal frame members 40). The top panel deflectors 12A may be configured to reduce entry (e.g., prevent entry) of dust and/or fluid into the interior 14 of the enclosure 10, for example, by providing a barrier between an outer face of the respective upper horizontal frame members 40 and respective edges of the top panel 22, for example, as explained herein with respect to FIG. 2.

As shown in FIG. 1, the partial enclosure 10 may be provided with one or more upper frame deflectors 12B, for example, at an interface between one or more of the upper horizontal frame members 40 and a vertical panel adjacent to and/or abutting the upper horizontal frame members 40. In some such examples, the vertical panel may be a door panel. For example, upper frame deflectors 12B may be coupled to one or more of the upper horizontal frame members 40 (e.g., to each of the upper horizontal frame members 40). The upper frame deflectors 12B may be configured to reduce entry (e.g., prevent entry) of dust and/or fluid into the interior 14 of the enclosure 10, for example, by providing a barrier and/or a channel between an outer face of the upper horizontal frame members 40 and an inward facing edge of a vertical panel, for example, as explained herein with respect to FIG. 2. In some examples, the partial enclosure 10 may be provided with one or more lower frame deflectors 12C, for example, at an interface between one or more of the lower horizontal frame members 42 and a vertical panel adjacent to and/or abutting the lower horizontal frame members 42. In some such examples, the vertical panel may be a door panel. For example, a lower frame deflector 12C may be coupled to one or more of the lower horizontal frame members 42 (e.g., each of the lower horizontal frame members 42). The lower frame deflectors 12C may be configured to reduce entry (e.g., prevent entry) of dust and/or fluid into the interior 14 of the enclosure 10, for example, by providing a barrier and/or a channel between an outer face of the lower horizontal frame members 42 and an inward facing edge of a vertical panel, for example, in a manner at least similar to the upper frame deflectors 12B. In some examples, one or more of the lower frame deflectors 12C may be inverted relative to the orientation of one or more of the upper frame deflectors 12B, for example, relative to the enclosure 10. In some examples, one or more of the upper frame deflectors 12B and one or more of the lower frame deflectors 12C may have an at least substantially similar configuration. In some examples, one or more of the upper frame deflectors 12B and one or more of the lower frame deflectors 12C may have a configuration that differs.

One or more of the top panel deflectors 12A, the upper frame deflectors 12B, or the lower frame deflectors 12C may be coupled to the enclosure 10 via, for example, one or more of adhesives, welding, or one or more fasteners. For example, as shown in FIG. 1, one or more of the frame members of the frame 18 may include one or more threaded studs 44 coupled thereto and extending outward, and, as explained herein, one or more of the top panel deflectors 12A, the upper frame deflectors 12B, or the lower frame deflectors 12C may include one or more holes configured to be placed over a respective threaded stud 44 and secured to the respective threaded stud 44 via a fastener, such as, for example, a nut.

Figure 2:
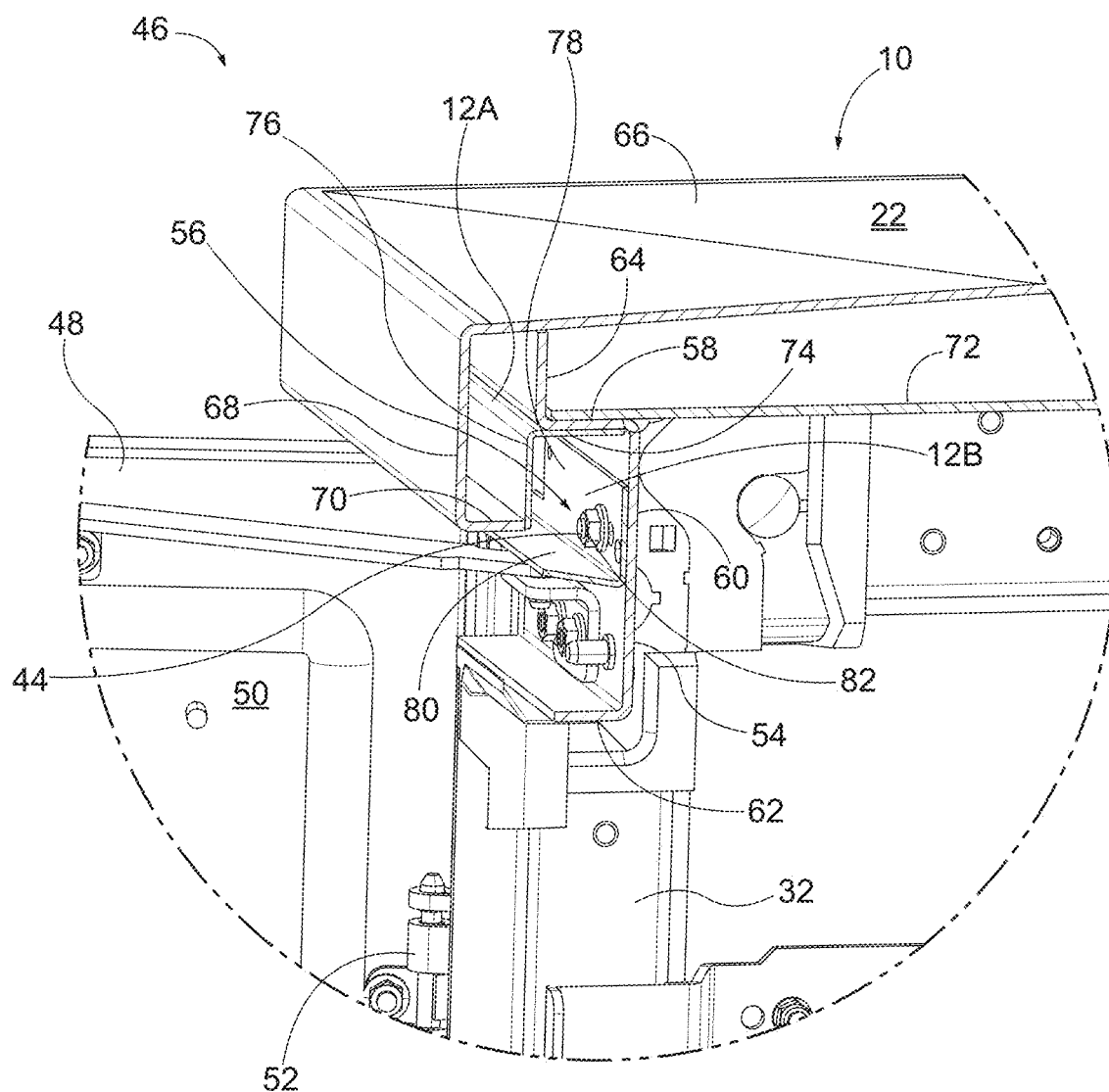
FIG. 2 is a schematic partial section perspective view of a corner of the example enclosure shown in FIG. 1 including an example door and two example deflectors.

FIG. 2 is a schematic partial section perspective view of a corner 46 of the example enclosure 10 shown in FIG. 1, including an example door 48, an example top panel deflector 12A, and an example upper frame deflector 12B. In the example shown in FIG. 2, the door 48 includes a door panel 50 coupled to the first vertical frame member 32 via one or more hinges 52 and is configured to move between a first, closed position, to a second, open position, for example, as shown in FIG. 2. The first vertical frame member 32 is coupled to an upper frame member 54 that forms part of the top side 24 of the frame 18. The example upper frame member 54 shown in FIG. 2 includes a channel 56 formed by an upper flange 58, a web 60, and a lower flange 62, with the upper flange 58 and lower flange 62 extending away from the interior 14 of the enclosure 10. The example upper frame member 54 also includes vertical flange 64 extending from a remote edge of the upper flange 58 and upward toward an interior side of the top panel 22. The example top panel 22 includes a face panel 66 extending horizontally across the top side 24 of the frame 18 and a perimeter flange 68 extending downward from the perimeter of the face panel 66. A remote edge of the example perimeter flange 68 includes a return flange 70 extending toward the web 60 of the upper frame member 54. The example enclosure 10 shown in FIG. 2 also includes an inner top panel 72, edges of which are adjacent to and/or supported by the upper flange 58 of the upper frame member 54.

In the example shown in FIG. 2, the top panel deflector 12A is coupled to an underside of the upper flange 58 of the upper frame member 54. For example, the top panel deflector 12A includes a first leg 74 coupled to a second leg 76 defining therebetween a deflector angle A. The first leg 74 is coupled to the underside of the upper flange 58, and the second leg 76 extends toward the return flange 70 of the top panel 22, for example, such that the second leg 76 provide a dust- and/or fluid-resistant barrier at the interface between a remote end of the return flange 70 and the upper flange 58 of the upper frame member 54. Although not shown in FIG. 2, the first leg 74 of the top panel deflector 12A may be coupled to the upper flange 58 via, for example, one or more of adhesives, welding, or one or more fasteners. For example, the upper flange 58 may include one or more threaded studs coupled thereto and extending downward, and the top panel deflector 12A may include one or more holes, for example, as described with respect to FIGS. 5A and 5B, with the one or more holes configured to be placed over respective threaded studs and secured to the respective threaded studs via fasteners, such as, for example, nuts.

In the example shown in FIG. 2, the upper frame deflector 12B is coupled to an outward facing side of the web 60 of the upper frame member 54. For example, the upper frame deflector 12B includes a first leg 78 coupled to a second leg 80 defining therebetween a deflector angle B. In some examples, the deflector angle B may be an acute angle, for example, ranging between about 45 degrees and about 85 degrees, between about 50 degrees and about 85 degrees, between about 70 degrees and about 85 degrees, between about 75 degrees and about 85 degrees, or between about 75 degrees and 80 degrees. In the example shown in FIG. 2, the first leg 78 is coupled to the outward facing side of the web 60, and the second leg 80 extends slightly upward and toward an inner surface of the door panel 50 when the door 48 is in the second closed position, for example, such that the second leg 80 provides a dust- and/or fluid-resistant barrier or channel at the interface between the upper frame member 54 (e.g., the web 60) and the inner surface of the door 48. In some examples, the deflector angle B between the first leg 78 and the second leg 80 of the upper frame deflector 12B provides a channel directing dust and/or fluid away from an edge of the door 48 remote from the one or more hinges 52, for example, as explained with respect to FIGS. 3 and 4. The first leg 78 of the upper frame deflector 12B may be coupled to outward facing side of the web 60 of the upper frame member 54 via, for example, one or more of adhesives, welding, or one or more fasteners. For example, the web 60 may include one or more threaded studs 44 coupled thereto and extending outward, and the upper frame deflector 12B may include one or more holes, for example, as described with respect to FIGS. 7A and 7B, with the one or more holes configured to be placed over respective threaded studs 44 and secured to the respective threaded studs via fasteners, such as, for example, nuts 82.

Figure 3:
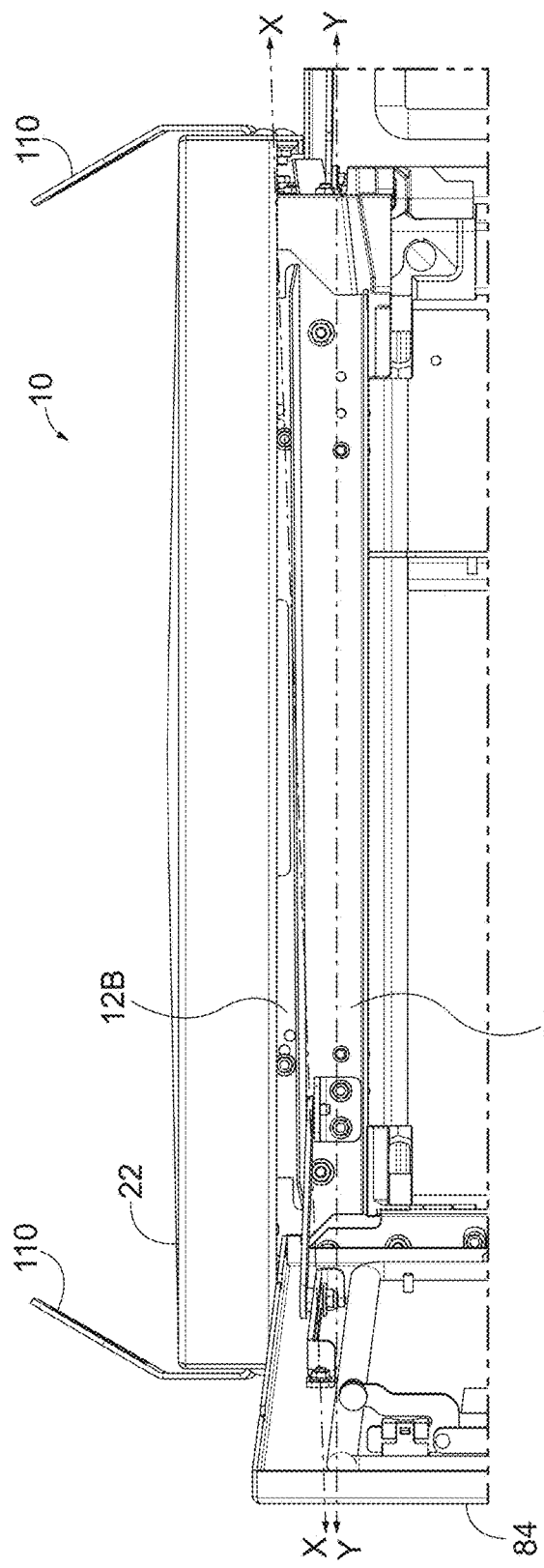
FIG. 3 is a partial schematic front view of an example enclosure having an example single front door and including an example deflector coupled to the enclosure in an example orientation relative to the enclosure.

FIG. 3 is a partial schematic front view of an example enclosure 10 having an example single front door 84 and including an example upper frame deflector 12B coupled to the enclosure 10 in an example orientation relative to the enclosure 10. The example enclosure 10 shown in FIG. 3 includes a top panel 22 and an upper frame member 54 extending across the front of the enclosure 10. The door 84 is supported by a first vertical frame member 32 by one or more hinges not shown in FIG. 3 (see, e.g., FIG. 2), such that the door 84 opens to the left and closes to the right as shown in FIG. 3. As shown in FIG. 3, the example upper frame deflector 12B is coupled to the outward facing surface of the web 60, such that it extends across the majority of the width of the front of the enclosure 10 and such that a longitudinal axis X of the upper frame deflector 12B is tilted slightly downward and to the left as depicted in FIG. 3 (e.g., such that the longitudinal axis Y of the upper frame member 54 and the longitudinal axis X of the upper frame deflector 12B are not parallel to with respect to one another). As a result, if the enclosure 10 is supported on a level surface, dust and/or fluid captured by the second leg 80 of the upper frame deflector 12B travels to the left end (as shown) of the upper frame member 54 and toward the first vertical frame member 32, which supports the door 84. Thereafter, the dust and/or fluid may flow down the first vertical frame member 32 and not into the interior 14 of the enclosure 10. As explained with respect to FIGS. 7A-7C, some examples of the upper frame deflector 12B include holes arranged such that the longitudinal axis Y of the upper frame member 54 and the longitudinal axis X of the upper frame deflector 12B are not parallel to with respect to one another.

Although not shown in FIG. 3, for at least some example enclosures configured at least similarly to the example enclosure 10 shown in FIG. 3, the lower frame deflector 12C may be inverted relative to the orientation of the upper frame deflector 12B shown in FIG. 3 relative to the enclosure 10. In some such examples, the lower frame deflector 12C may be oriented relative to lower horizontal frame members 42, such that dust and/or fluid are carried toward the first vertical frame member 32 and away from entry into the interior 14 of the enclosure 10.

Figure 4:
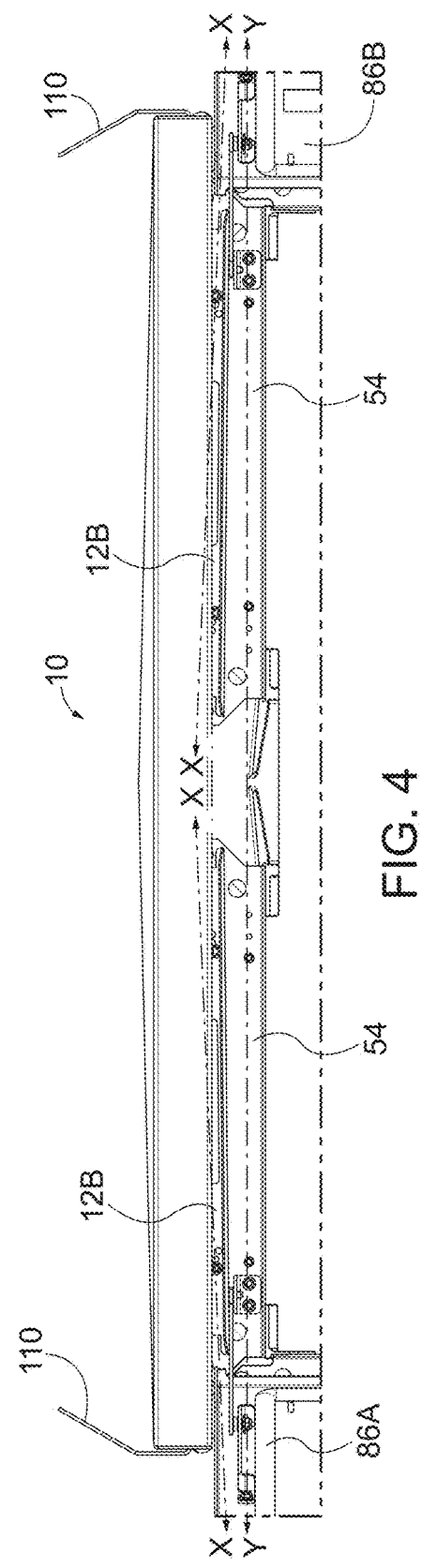
FIG. 4 is a partial schematic front view of an example enclosure having two example front doors and including two example deflectors coupled to the enclosure in respective example orientations relative to the enclosure.

FIG. 4 is a partial schematic front view of an example enclosure 10 having two example front doors 86A and 86B and including two example upper frame deflectors 12B coupled to the enclosure 10 in respective example orientations relative to the enclosure 10. The example enclosure shown in FIG. 4 includes a top panel 22 and an upper frame member 54 extending across the front of the enclosure 10. The two doors 86A and 86B are supported by the first vertical frame member 32 and a third vertical frame member 88, respectively, by one or more hinges not shown in FIG. 4, such that the door 86A opens to the left and closes to the right, and the door 86B opens to the right and closes to the left, as shown in FIG. 4, for example, such that respective remote edges of the doors 86A and 86B meet in at a location between the first vertical frame member 32 and the third vertical frame member 88 (e.g., substantially equidistant between the first vertical frame member 32 and the third vertical frame member 88). In some examples, the remote edges of the doors 86A and 86B may overlap when both doors 86A and 86B are closed, for example, as described with respect to FIG. 12.

As shown in FIG. 4, two example upper frame deflectors 12B are coupled to the outward facing surface of the web 60 of the upper frame member 54, such that they each extend across at least a majority of a portion of the width of the front of the enclosure 10 corresponding to the width of the enclosure 10 closed by a respective one of the doors 86A and 86B. For example, the length of each of the upper frame deflectors 12B substantially corresponds to the portion of the width of the front of the enclosure 10 closed by one of the doors 86A or 86B, for example, as shown FIG. 4. In addition, each of the upper frame deflectors 12B is coupled to the upper frame member 54 (e.g., to the web 60), such that a longitudinal axis X of each of the upper frame deflectors 12B is tilted slightly downward and toward the first vertical frame member 32 and the third vertical frame member 88, respectively, as depicted in FIG. 4 (e.g., such that the longitudinal axis Y of the upper frame member 54 and the longitudinal axes X and X of the upper frame deflectors 12B are not parallel to with respect to one another). As a result, if the enclosure 10 is supported on level surface, dust and/or fluid captured by the respective second legs 80 of each of the upper frame deflectors 12B travels from a location along the width of the enclosure corresponding to where the remote edges of the doors 86A and 86B meet when closed, and outward toward the opposite ends of the enclosure 10. Thereafter, the dust and/or fluid may flow down the respective first vertical frame member 32 and third vertical frame member 88 and not into the interior 14 of the enclosure 10. As explained with respect to FIGS. 7A-7C, some examples of the upper frame deflector 12B include holes arranged, such that the longitudinal axis Y of the upper frame member 54 and the longitudinal axes X and X of the upper frame deflectors 12B are not parallel to with respect to one another.

Although not shown in FIG. 4, for at least some example enclosures configured at least similarly to the example enclosure 10 shown in FIG. 4, lower frame deflectors 12C may be inverted relative to the orientation of the upper frame deflectors 12B shown in FIG. 4 relative to the enclosure 10. In some such examples, the lower frame deflectors 12C may be oriented relative to lower frame members, such that dust and/or fluid are carried toward the first vertical frame member 32 and toward the third vertical frame member 88 and away from entry into the interior 14 of the enclosure 10.

Figure 5A:
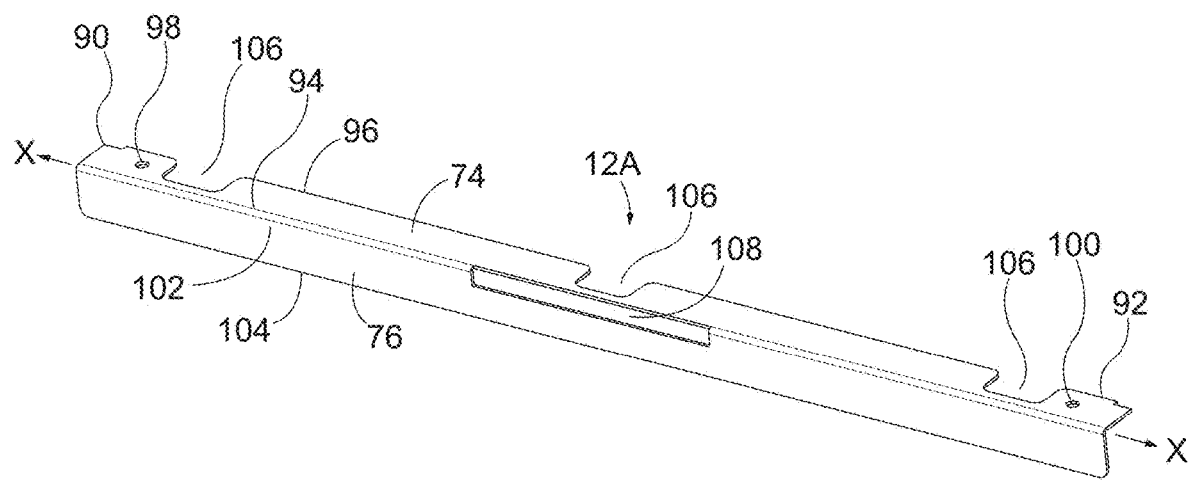
FIG. 5A is a schematic perspective view of an example deflector.
Figure 5B:
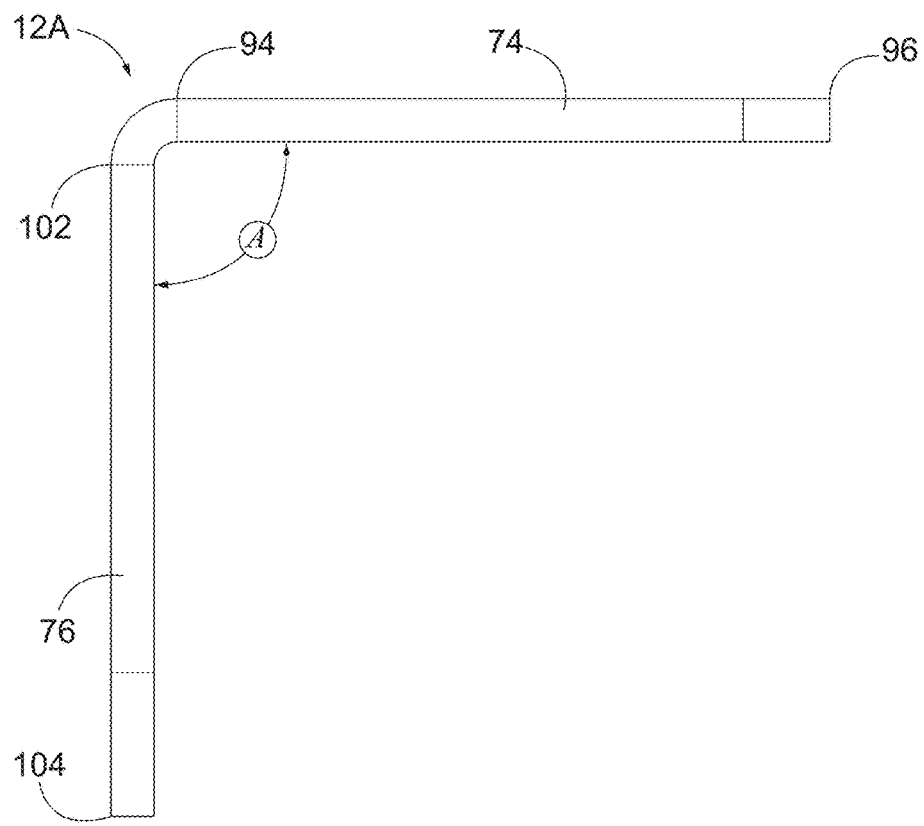
FIG. 5B is a schematic end view of the example deflector shown in FIG. 5A.

FIGS. 5A and 5B are schematic views of an example top panel deflector 12A defining a longitudinal axis X extending between a first end 90 of the top panel deflector 12A and a second end 92 of the top panel deflector 12A opposite the first end 90. As shown in FIG. 5A, the example top panel deflector 12A may include an elongated first leg 74 defining a first intersection edge 94 and a first remote edge 96 opposite the first intersection edge 94. In the example shown, the first leg 74 defines a first hole 98 adjacent the first end 90 of the first leg 74 and a second hole 100 adjacent the second end 92 of the first leg 74. The example top panel deflector 12A also includes an elongated second leg 76 defining a second intersection edge 102 and a second remote edge 104 opposite the second intersection edge 102. As shown in FIG. 5B, the first intersection edge 94 and the second intersection edge 102 are coupled to one another to define a deflector angle A. In the example shown in FIG. 5B, the deflector angle A is substantially perpendicular, although other deflector angles A are contemplated. As described with respect to FIG. 1, the first hole 98 may be configured to receive a first threaded stud 44 associated with the enclosure 10 (e.g., coupled to the frame 18), and the second hole 100 may be configured to receive a second threaded stud 44 associated with the enclosure 10. For example, respective nuts may be used to secure the top panel deflector 12A to the studs. In some examples, the first leg 74 may be configured to be coupled to an underside of the top panel 22, for example, via the upper flange 58 of the upper frame member 54, for example, as described with respect to FIG. 2. In some such examples, the second leg 76 may extend in a direction away from a plane defined by the top panel 22, for example, as described with respect to FIG. 2.

As shown in FIG. 5A, in some examples of the top panel deflector 12A, the first leg 74 may define one or more clearance recesses 106 (e.g., three clearances recesses 106) extending from the first remote edge 96 toward the first intersection edge 94. In some examples, the one or more clearance recesses 106 may provide clearance for other portions of the frame 18 and/or the top panel 22. In some examples, the first leg 74 and/or the second leg 76 may define one or more elongated slots 108 extending in a direction substantially parallel to the longitudinal axis X of the top panel deflector 12A. The one or more elongated slots 108 may provide a passage through which one or more handling fixtures 110 may extend (see, e.g., FIGS. 3 and 4). In some examples, the handling fixtures 110 may facilitate lifting and/or transport of the enclosure 10.

Figure 6A:
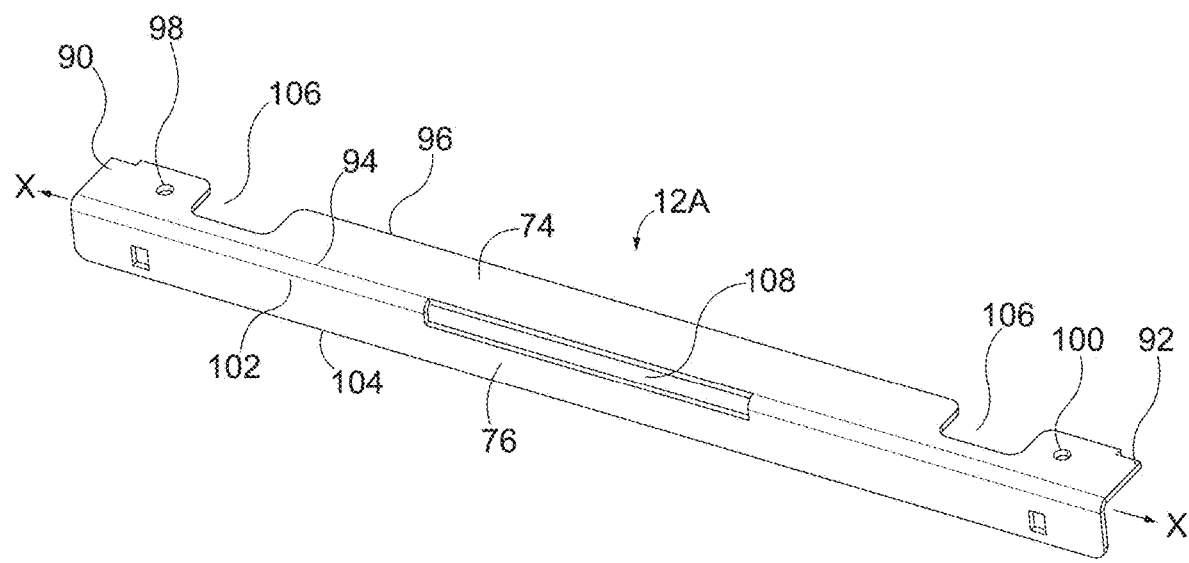
FIG. 6A is a schematic perspective view of another example deflector.
Figure 6B:
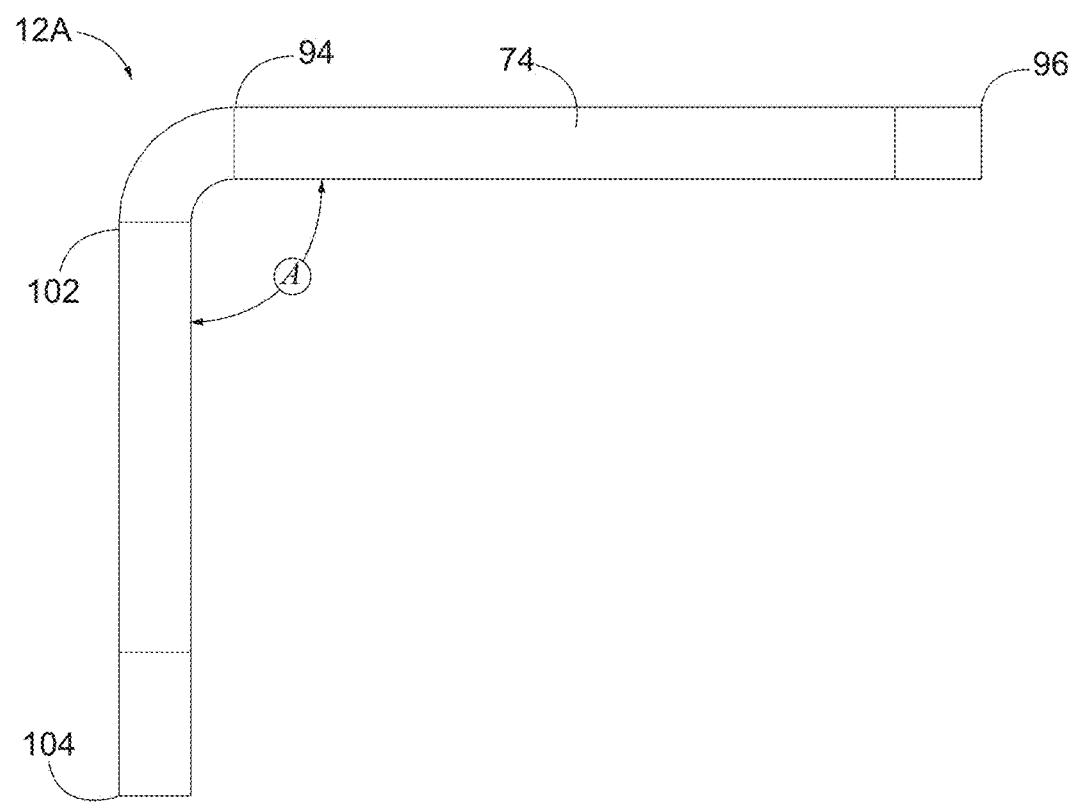
FIG. 6B is a schematic end view of the example deflector shown in FIG. 6A.

FIGS. 6A and 6B are schematic views of an example top panel deflector 12A at least similar to the top panel deflector 12A shown in FIGS. 5A and 5B. The example top panel deflector 12A shown in FIGS. 6A and 6B lacks a longitudinally centrally located clearance recess 106 present in the top panel deflector 12A shown in FIGS. 5A and 5B, which may be provided, for example, to provide clearance associated with a door panel and/or related structures. The example top panel deflector 12A shown in FIGS. 6A and 6B may be configured to be coupled to frame members on one or more sides of the enclosure 10 not provided with one or more doors and/or associated structures.

Figure 7A:
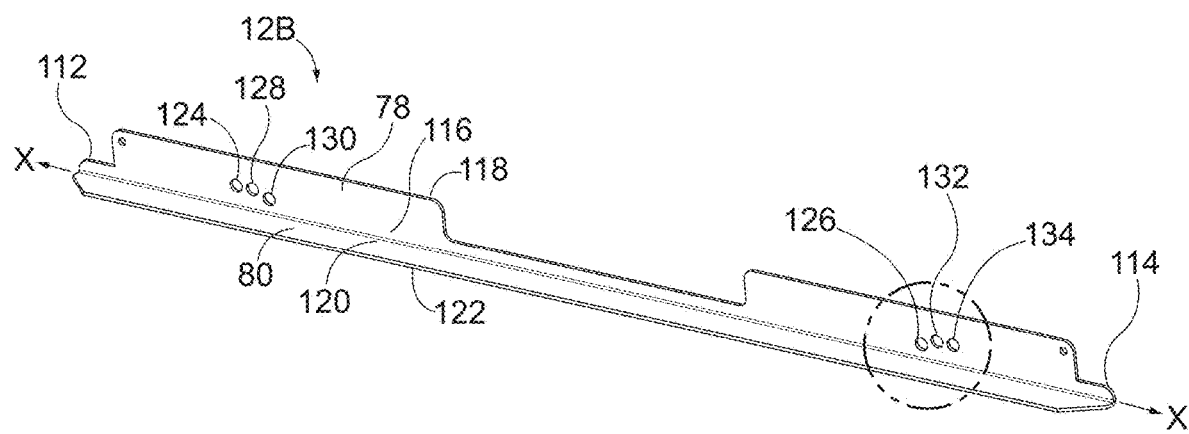
FIG. 7A is a schematic perspective view of another example deflector.
Figure 7B:
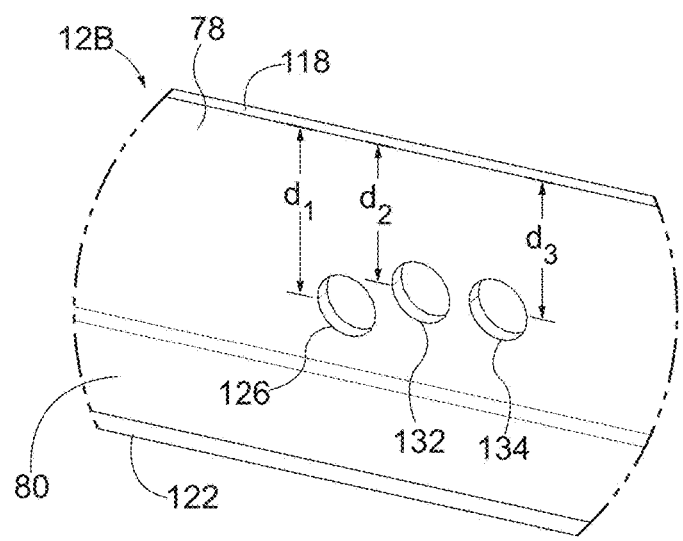
FIG. 7B is a schematic detailed perspective view of a portion of the example deflector shown in FIG. 7A.
Figure 7C:
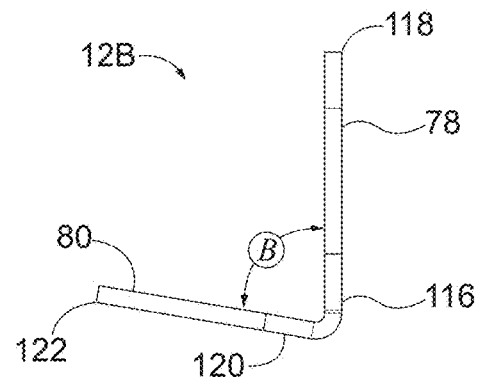
FIG. 7C is a schematic end view of the example deflector shown in FIGS. 7A and 7B.

FIGS. 7A, 7B, and 7C are schematic views of an example upper frame deflector 12B defining a longitudinal axis X extending between a first end 112 of the upper frame deflector 12B and a second end 114 of the upper frame deflector 12B opposite the first end 112. As shown in FIG. 7A, the example upper frame deflector 12B may include an elongated first leg 78 defining a first intersection edge 116 and a first remote edge 118 opposite the first intersection edge 116. The example upper frame deflector 12B also includes an elongated second leg 80 defining a second intersection edge 120 and a second remote edge 122 opposite the second intersection edge 120. As shown in FIG. 7C, the first intersection edge 116 and the second intersection edge 120 are coupled to one another to define a deflector angle B. In the example shown in FIG. 7C the deflector angle B is an acute angle, for example, as described with respect to FIG. 2, although other deflector angles B are contemplated.

As described with respect to FIG. 2, the first leg 78 of the upper frame deflector 12B is configured to be coupled to an outward facing side of a horizontal frame member of the enclosure 10, such that the second leg 80 extends in a direction away from a plane defined by the outward facing side of the horizontal frame member. For example, the first leg 78 of the upper frame deflector 12B may be coupled to an outward facing side of the web 60 of the upper frame member 54.

As shown in FIGS. 7A and 7B, the first leg 78 of the upper frame deflector 12B defines a first hole 124 adjacent the first end 112 of the first leg 78 and a second hole 126 adjacent the second end 114 of the first leg 78. In some examples, the upper frame deflector 12B may be configured to facilitate coupling the upper frame deflector 12B to the frame 18 (e.g., to the upper frame member 54), such that the longitudinal axis X of the upper frame deflector 12B may be at different angles relative to the longitudinal axis of the frame member to which the upper frame deflector 12B is coupled. For example, this may include coupling the upper frame deflector 12B to the upper frame member 54 such that the longitudinal axis X of the upper frame deflector 12B is not parallel to the longitudinal axis of the upper frame member 54, for example, as shown in FIGS. 3 and 4.

For example, as shown in FIGS. 7A and 7B, the first leg 78 of the upper frame deflector 12B may define a third hole 128 and a fourth hole 130 adjacent the first hole 124, and a fifth hole 132 and a sixth hole 134 adjacent the second hole 126. In some examples, the first hole 124 and the second hole 126 may be spaced a first longitudinal distance from one another, the third hole 128 and the fifth hole 132 may be spaced a second longitudinal distance from one another, and the fourth hole 130 and the sixth hole 134 may be spaced a third longitudinal distance from one another. In some examples, the first longitudinal distance, the second longitudinal distance, and the third longitudinal distance may be substantially equal. In some examples, the first, second, and/or third longitudinal distances may be substantially equal to a distance separating two or more studs 44 from one another. In some such examples, the upper frame deflector 12B may be mounted on the two or more studs 44, such hole pairs separated by the longitudinal distance corresponding to the distance between two of the studs 44 may be used to mount and couple the upper frame deflector 12B to the upper frame member 54, for example. In the example shown in FIG. 7A, the first hole 124 and the second hole 126 form a first example hole pair, the third hole 128 and the fifth hole 132 form a second example hole pair, and the fourth hole 130 and the sixth hole 134 form a third example hole pair.

As shown in FIGS. 7A and 7B, the first hole 124 and the second hole 126 (see FIG. 7B) are spaced a first edge distance $d_1$ from the first remote edge 118, the third hole 128 and the fifth hole 132 (see FIG. 7B) are spaced a second edge distance $d_2$ from the first remote edge 118, and the fourth hole 130 and the sixth hole 134 (see FIG. 7B) are spaced a third edge distance $d_3$ from the first remote edge 118. In some examples, for example, as shown, the first edge distance $d_1$, the second edge distance $d_2$, and the third edge distance $d_3$ differ from one another. In such examples, the spacing of the holes may facilitate coupling the upper frame deflector 12B to the upper frame member 54 at different relative angles/orientations, for example, as shown in FIGS. 3 and 4. In some examples, one or more the first edge distance $d_1$, the second edge distance $d_2$, or the third edge distance $d_3$ may be substantially the same.

Figure 8:
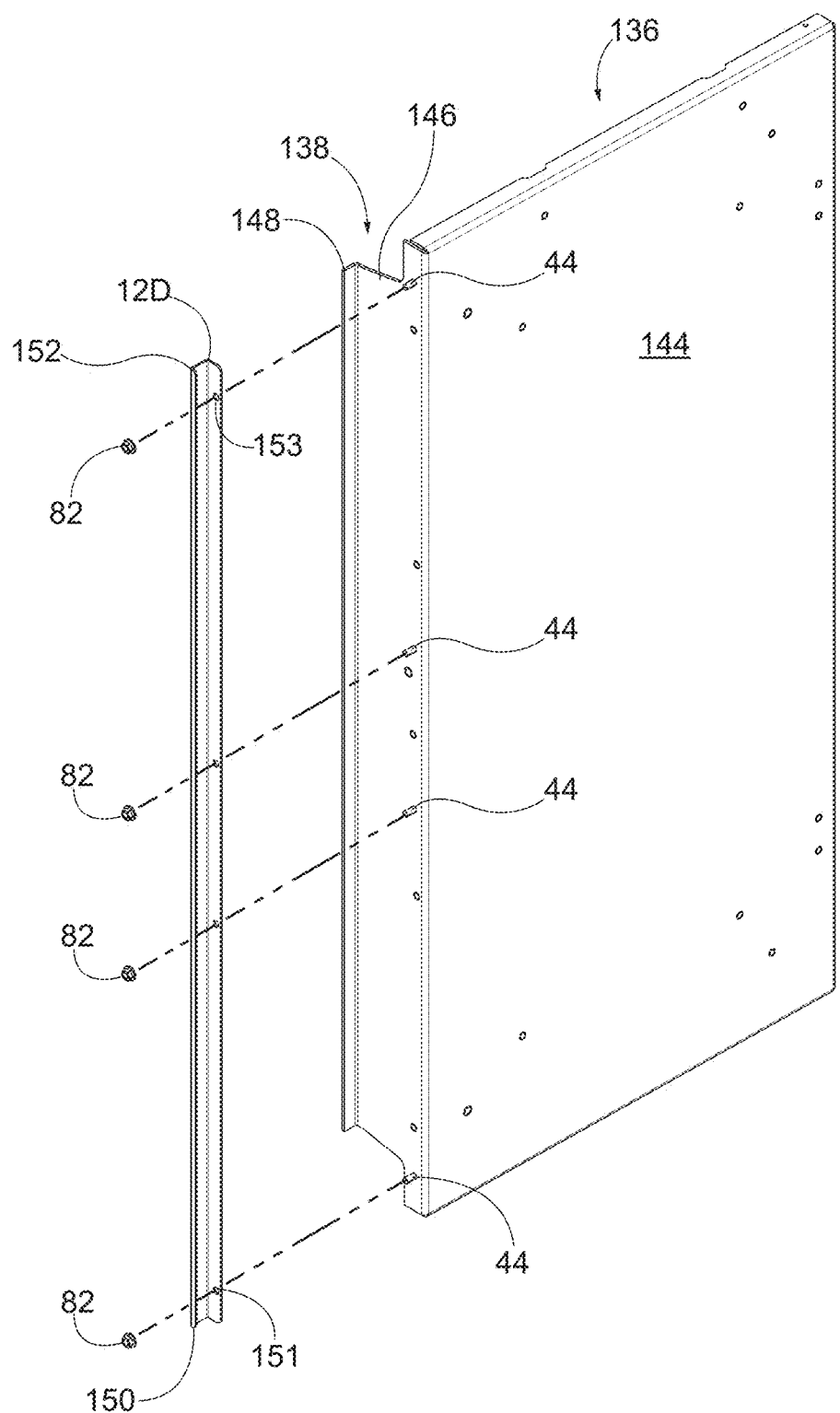
FIG. 8 is a schematic perspective view of an example end panel for an example enclosure and including an example deflector.
Figure 9:
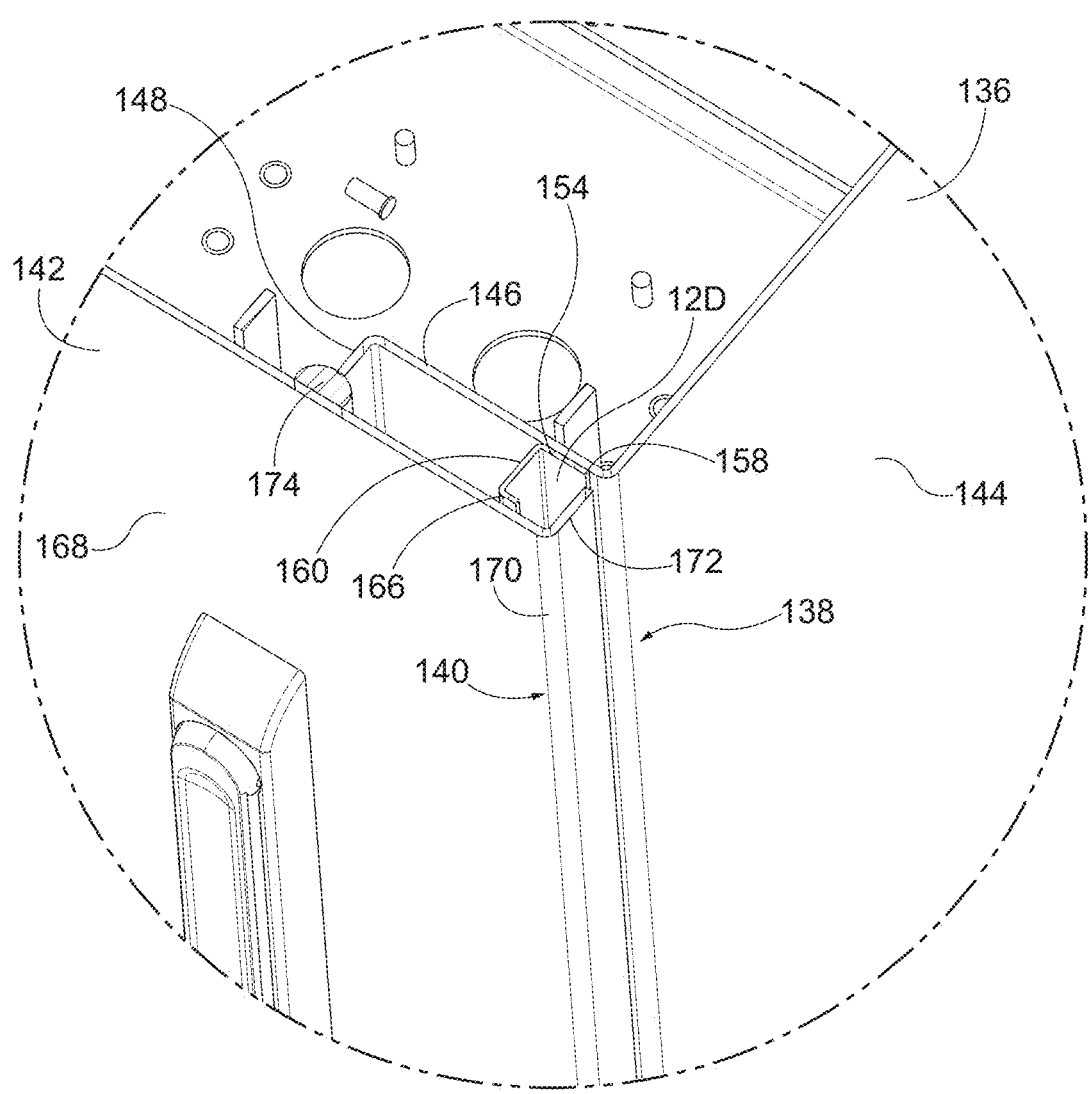
FIG. 9 is a schematic partial section perspective view of a corner of an example enclosure including the example end panel and example deflector shown in FIG. 8 relative to an example door of an example enclosure.
Figure 10A:
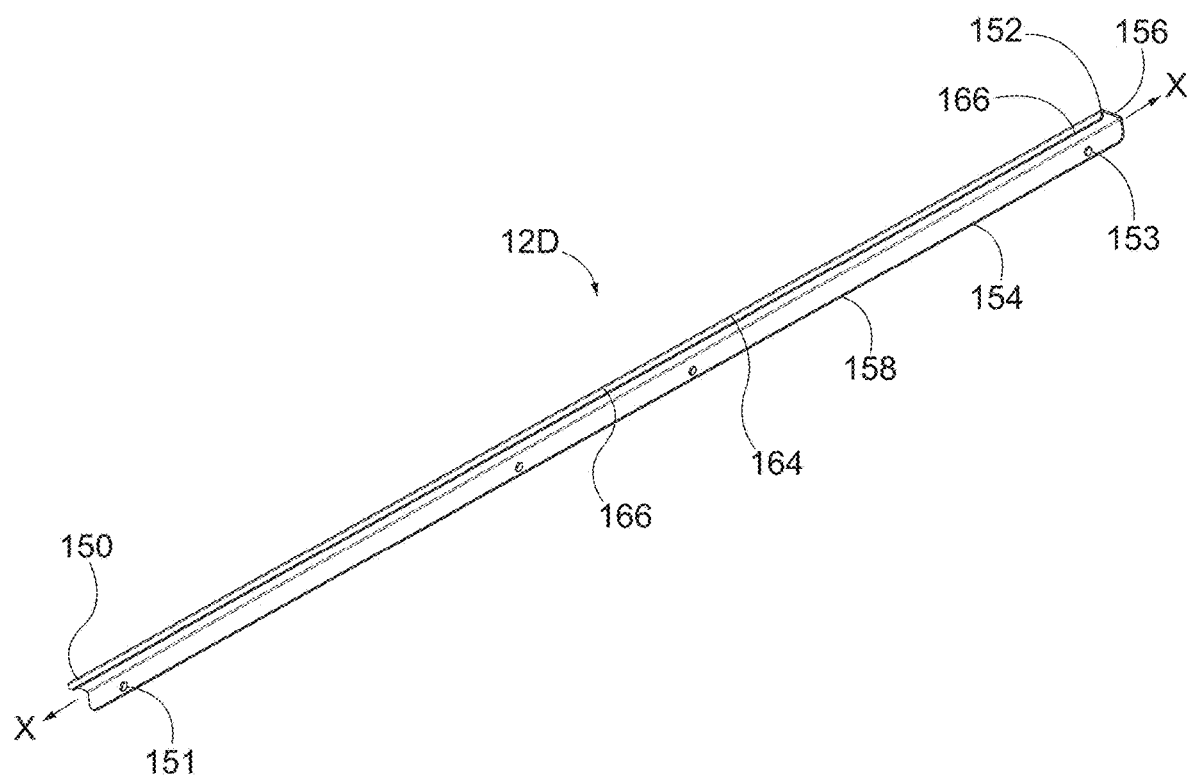
FIG. 10A is a schematic perspective view of the example deflector shown in FIGS. 8 and 9.
Figure 10B:
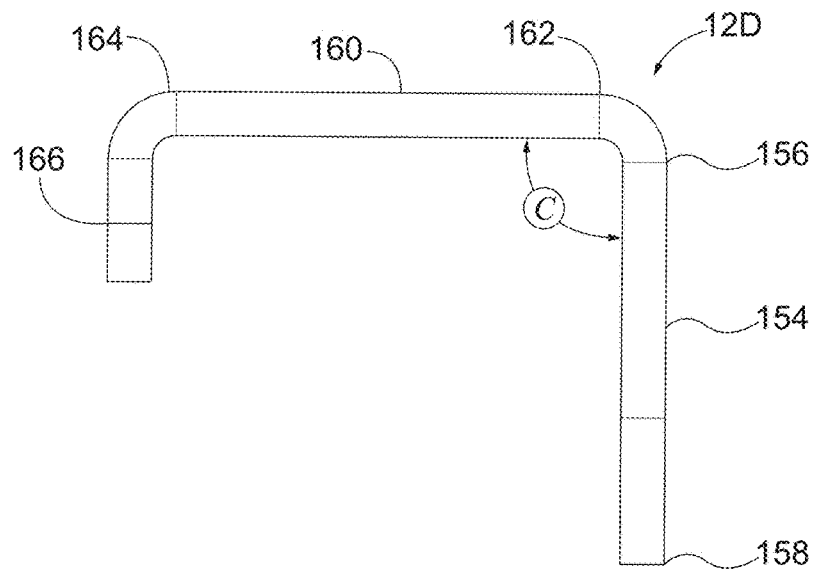
FIG. 10B is a schematic end view of the example deflector shown in FIG. 10A.

FIG. 8 is a schematic perspective view of an example end panel 136 for an example enclosure 10 and including an example vertical edge deflector 12D. The example end panel 136 may be a door panel, for example, configured to be coupled to the second side 28 of the frame 18 shown in FIG. 1. Referring to FIG. 1, the example end panel 136 may be configured to be coupled to the second vertical frame member 34, for example, via one or more hinges, so that the end panel 136 may pivot between a closed position closing a corresponding end of the enclosure 10 and an open position allowing access to the interior 14 of the enclosure 10. As shown in FIG. 9, a remote edge 138 of the end panel 136 may be configured to abut against a remote edge 140 of a front panel 142, which may be coupled to the first vertical frame member 32 of the enclosure (see FIG. 1), for example, via one or more hinges, so that the front panel 142 may pivot between a closed position closing the front of the enclosure 10 and an open position allowing access to the interior 14 of the enclosure 10.

Referring to FIGS. 8 and 9, the end panel 136 may include a face panel 144 terminating at the remote edge 138, and an edge flange 146 extending from the remote edge 138 inwardly toward the interior 14 of the enclosure 10 when in the closed position. A seal flange 148 may extend from a remote end of the edge flange 146, for example, in a direction away from the interior 14 of the enclosure 10.

As shown in FIGS. 8, 9, 10A, and 10B, the example vertical edge deflector 12D may define a longitudinal axis X extending between a first end 150 and a second end 152 of the vertical edge 12D deflector opposite the first end 150. In some examples, the vertical edge deflector 12D may include an elongated first leg 154 defining a first intersection edge 156 and a first remote edge 158 opposite the first intersection edge 156. The first leg 154 may also define a first hole 151 adjacent the first end 150 of the first leg 154 and a second hole 153 adjacent the second end 152 of the first leg 154 (and in some examples, additional holes). The vertical edge deflector 12D may also include an elongated second leg 160 defining a second intersection edge 162 and a second remote edge 164 opposite the second intersection edge 162. The first intersection edge 156 and the second intersection edge 162 may be coupled to one another to define a deflector angle C, which in the example shown is substantially perpendicular, although other angles are contemplated.

As shown in FIG. 8, the first hole 151 may be configured to receive a first mounting stud 44 associated with the enclosure 10 (e.g., coupled to the edge flange 146 of the end panel 136), and the second hole 153 may be configured to receive a second mounting stud 44 associated with the enclosure 10 (e.g., coupled to the edge flange 146 of the end panel 136). In the example shown, the vertical edge deflector 12D includes a flange 166 extending from the second remote edge 164 of the second leg 160 in a direction substantially parallel to the first leg 154. In the example shown, the first leg 154 is configured to be coupled to a vertical side edge of the end panel 136 at an end of the face panel 144 remote from the one or more hinges supporting the end panel 136, and the second leg 160 may extend in a direction substantially parallel to a plane defined by the face panel 144 of the end panel 136 (e.g., an outward facing surface of a door).

Referring to FIG. 9, the example front panel 142 (e.g., a door) includes a face panel 168 terminating at a remote edge 170, and an edge flange 172 extending from the remote edge 170 inwardly toward the interior 14 of the enclosure 10 when in the closed position. In some examples, an interior side of the front panel 142 may include a seal 174 extending at least partially around and adjacent a perimeter of the interior side of the face panel 168 of the front panel 142. As shown in FIG. 9, when the end panel 136 and the front panel 142 are both in the closed position, a remote end of the seal flange 148 of the end panel 136 abuts and/or presses against a cooperating portion of the seal 174, and the second leg 160 of the vertical edge deflector 12D and the flange 166 of the vertical edge deflector provide a barrier and/or a channel at an interface between the remote edge 138 of the end panel 136 and the remote edge 140 of the front panel 142, thereby causing dust and/or fluid to fall down the barrier and/or channel to the base of the enclosure 10 rather than into the interior 14 of the enclosure 10.

Figure 11:
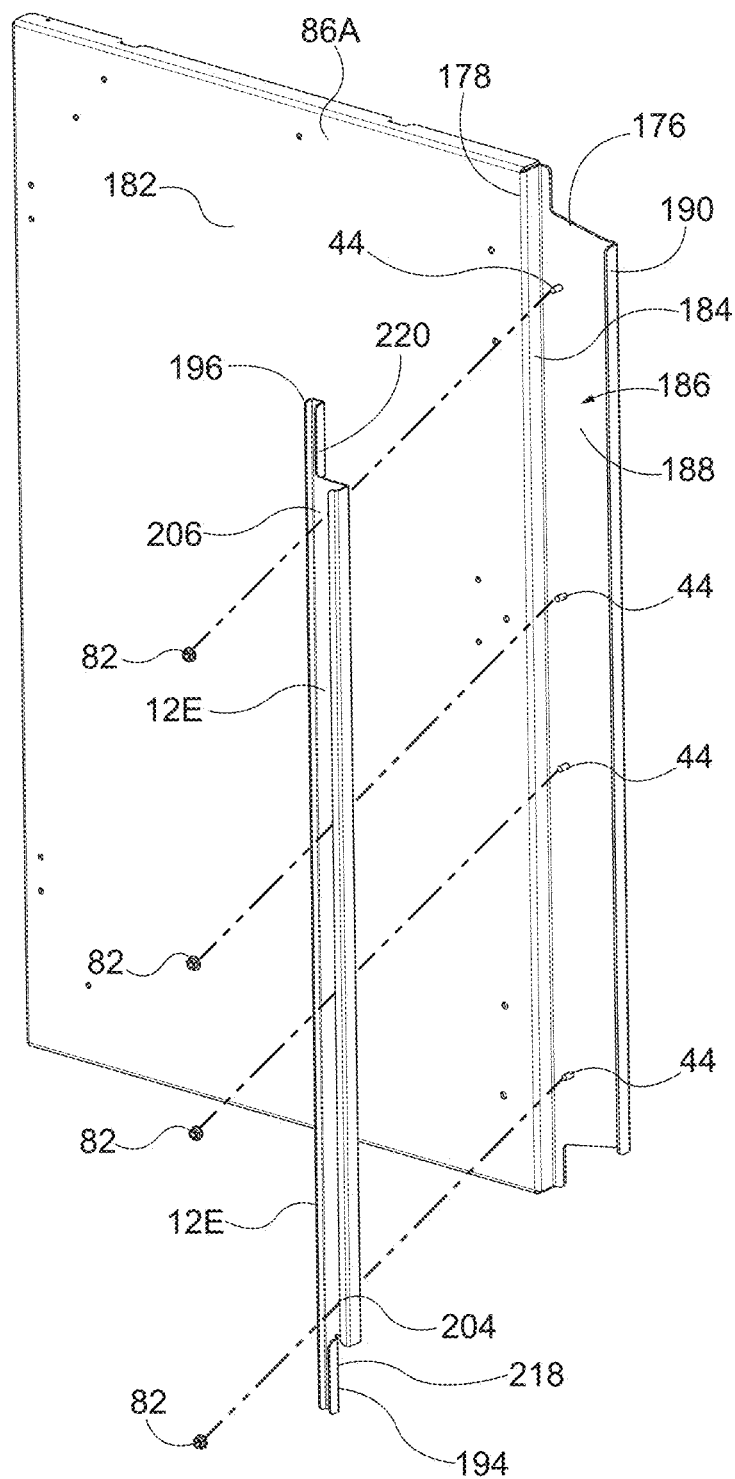
FIG. 11 is a schematic perspective front view of an example door for an example enclosure having two doors and including an example deflector.
Figure 12:
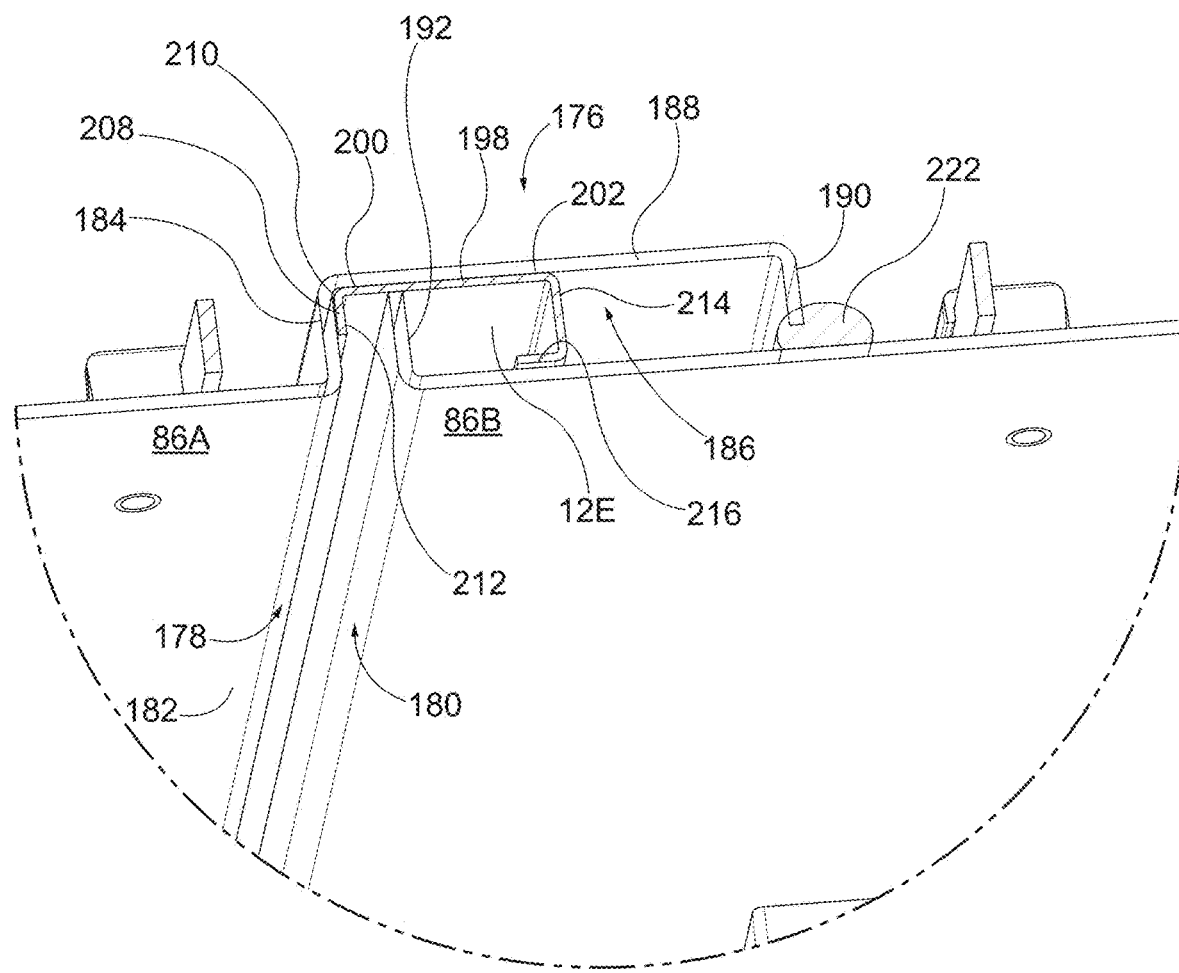
FIG. 12 is a schematic partial section perspective view of an example enclosure, including two partially overlapping doors and including the example door and example deflector shown in FIG. 11.
Figure 13A:
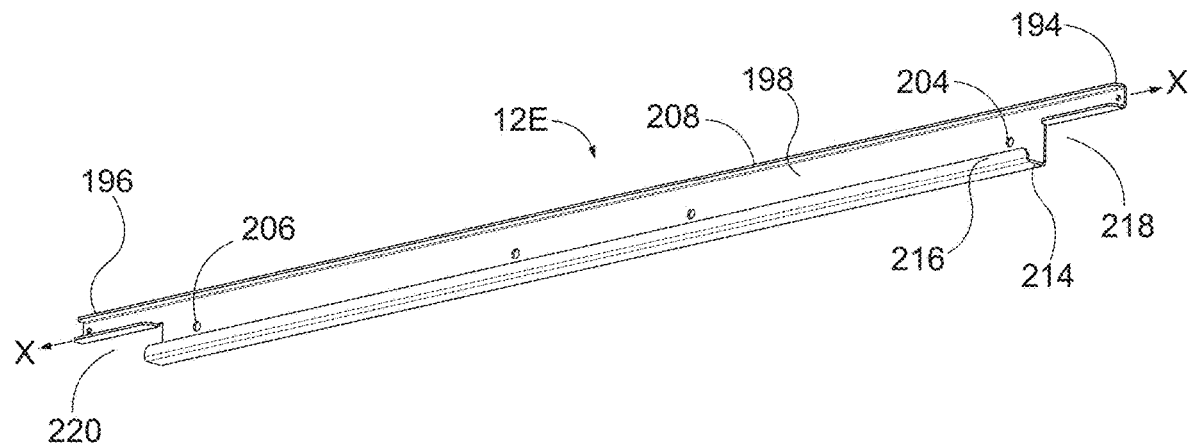
FIG. 13A is a schematic perspective view of the example deflector shown in FIGS. 11 and 12.
Figure 13B:
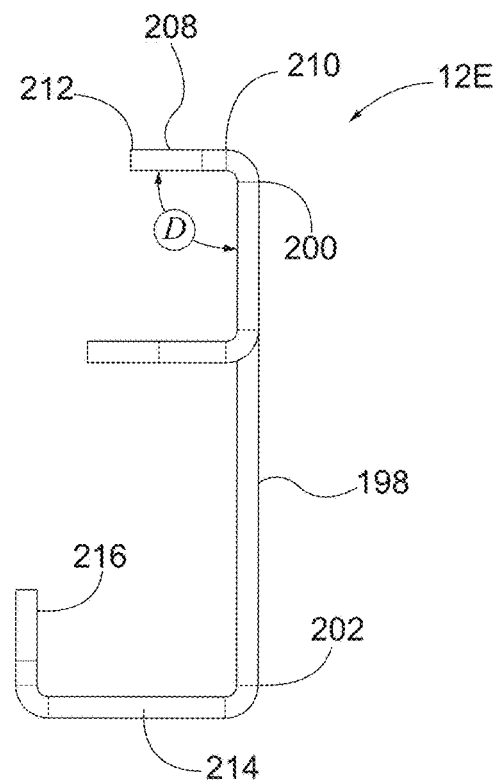
FIG. 13B is a schematic end view of the example deflector shown in FIG. 13A.

FIG. 11 is a schematic perspective view of an example first door 86A for an example enclosure 10 having two doors on the same side of the enclosure 10, such as, for example, the enclosure shown in FIG. 4. FIG. 11 also shows an example edge overlap deflector 12E configured to be coupled to an overlapping edge portion 176 of the first door 86A. For example, the first door 86A may be coupled to a first vertical frame member, for example, via one or more hinges, so that the first door 86A may pivot between a closed position partially closing, for example, the front of the enclosure 10, and an open position allowing access to the interior 14 of the enclosure 10. The enclosure 10 may also include a second door 86B (see, e.g., FIG. 4), which may be coupled to a second vertical frame member on the same side of the enclosure 10 as the first vertical frame member, for example, via one or more hinges, so that the second door 86B may pivot between a closed position partially closing, for example, the front of the enclosure 10, and an open position allowing access to the interior 14 of the enclosure 10. As shown in FIG. 12, a remote edge 178 of the first door 86A may be configured to abut against and partially overlap a remote edge 180 of the second door 86B when both the first door 86A and the second door 86B are in the closed positions.

Referring to FIGS. 11 and 12, the first door 86A may include a face panel 182 terminating at the remote edge 178, and an edge flange 184 extending from the remote edge 178 inwardly toward the interior 14 of the enclosure 10 when in the closed position. The edge flange 184 may partially form an edge channel 186 of the first door 86A, and a web 188 may extend from a remote edge of the edge flange 184 in a direction substantially parallel to the face panel 182 in a direction toward the second vertical frame member supporting the second door 86B. A return flange 190 may extend from an end of the web 188 remote from the edge flange 184 away from the interior 14 of the enclosure 10 when the first door 86A is in the closed position. The second door 86B may include an edge flange 192 extending from the remote edge 180 of the second door 86B toward the interior 14 of the enclosure 10 when the second door 86B is in the closed position.

As shown in FIGS. 11, 12, 13A, and 13B, the example overlap edge deflector 12E may define a longitudinal axis X extending between a first end 194 and a second end 196 of the overlap edge deflector 12E opposite the first end 194. In some examples, the overlap edge deflector 12E may include an elongated first leg 198 defining a first intersection edge 200 and a first remote edge 202 opposite the first intersection edge 200. The first leg 198 may also define a first hole 204 adjacent the first end 194 of the first leg 198 and a second hole 206 adjacent the second end 196 of the first leg 198. Additional holes are contemplated. The overlap edge deflector 12E may also include an elongated second leg 208 defining a second intersection edge 210 and a second remote edge 212 opposite the second intersection edge 210. The first intersection edge 200 and the second intersection edge 210 may be coupled to one another to define a deflector angle D, which in the example shown is substantially perpendicular, although other angles are contemplated.

As shown in FIG. 11, the first hole 204 and the second hole 206 (and in some examples, additional holes) may be configured to receive first and second mounting studs 44 associated with the enclosure 10 (e.g., coupled to web 188 of the remote edge 178 of the first door 86A). In the example shown, the overlap edge deflector 12E includes a first flange 214 extending from the first remote edge 202 of the first leg 198 in a direction substantially parallel to the second leg 208. The overlap edge deflector 12E also includes a second flange 216 extending from a remote edge of the first flange 214 in a direction substantially parallel to the first leg 198 and toward the second leg 208. In some examples, as shown, the first leg 198 may at least partially define a first recess 218 at the first end 194 extending inward from the first remote edge 202 of the first leg 198, and a second recess 220 at the second end 196 extending inward from the first remote edge 202 of the first leg 198. The overlap edge deflector 12E may be configured such that the first leg 198 is coupled to a vertical edge of the first door 86A remote from one or more hinges supporting the first door 86A, and the second leg 208 may abut a portion of the first door 86A (e.g., the edge flange 184 of the first door 86A).

Referring to FIG. 12, in some examples, an interior side of the second door 86B may include a seal 222 extending at least partially around and adjacent a perimeter of the interior side of the second door 86B, for example, along its remote edge 180. When the example first door 86A and the example second door 86B are both in the closed positions, an end of the return flange 190 of the remote edge 180 of the first door 86A abuts and/or presses against the seal 222. The first flange 214 extending from the first remote edge 202 of the first leg 198 (and/or the second flange 216) abuts and/or presses against in interior side of the second door 86B, the edge flange 192 of the second door 86B abuts the first leg 198 of the overlap edge deflector 12E inside the edge channel 186 of the overlap edge deflector 12E, for example, at the web 188. The edge flange 192 of the second door 86B and the second leg 208, the first leg 198, the first flange 214, and the second flange 216 of the overlap edge deflector 12E provide a barrier and/or a channel at an interface between the remote edge 178 of the first door 86A and the remote edge 180 of the second door 86B, thereby causing dust and/or fluid to fall down the barrier and/or channel to the base of the enclosure 10 rather than into the interior 14 of the enclosure 10.

An example process for reducing entry of dust and/or fluid into an enclosure configured to enclose in an interior thereof a plurality of optical communication connections may include coupling a deflector to a portion of the enclosure. The enclosure may include, for example, an upper frame member, a lower frame member, a vertical frame member extending between the lower frame member and the upper frame member, an upper panel coupled to the upper frame member, and a door coupled to the enclosure and configured to pivot between a closed position and an open position. The process, in some examples, may include coupling the deflector to the upper frame member, the lower frame member, the upper panel, and/or a vertical edge of the door. The deflector, in some examples, may include an elongated first leg defining a first intersection edge and a first remote edge opposite the first intersection edge. The first leg may define a first hole adjacent the first end of the first leg and a second hole adjacent the second end of the first leg. The deflector may also include an elongated second leg defining a second intersection edge and a second remote edge opposite the second intersection edge. The first intersection edge and the second intersection edge may be coupled to one another to define a deflector angle. The first leg of the deflector may be configured and coupled to the one of the upper frame member, the lower frame member, the upper panel, or the vertical edge of the door, such that dust and/or fluid is substantially prevented from entering the interior of the enclosure.

In some examples of the process, coupling the deflector to the upper frame member, the lower frame member, the upper panel, and/or a vertical edge of the door may include mounting the deflector over at least one mounting stud coupled to the enclosure and securing the deflector to the at least one mounting stud. In some examples of the process, coupling the deflector to the upper frame member, the lower frame member, the upper panel, and/or a vertical edge of the door may include coupling a first deflector to the upper frame member. In some such examples, the process may also include coupling a second deflector to the lower frame member, coupling a third deflector to the upper panel, and/or coupling a fourth deflector to the vertical edge of the door.

In some examples of the process, coupling the deflector to the upper frame member, the lower frame member, the upper panel, and/or a vertical edge of the door may include coupling a first deflector to the upper frame member and coupling a second deflector to the vertical edge of the door. In some such examples, coupling the first deflector to the upper frame member may include coupling the first deflector to the upper frame member such that a longitudinal axis of the first deflector is oblique with respect to a longitudinal axis of the upper frame member.

In some examples of the process, the enclosure may include a first door and a second door, and coupling the deflector to the upper frame member, the lower frame member, the upper panel, and/or a vertical edge of the door may include coupling a first deflector to the upper frame member adjacent the first door, and coupling a second deflector to the upper frame member adjacent the second door. In some such examples, coupling the first deflector to the upper frame member adjacent the first door and coupling the second deflector to the upper frame member adjacent the second door may include coupling the first deflector and coupling the second deflector, such that a longitudinal axis of the second deflector is oblique with respect to a longitudinal axis of the first deflector and oblique with respect to a longitudinal axis of the upper frame member.

In some examples of the process, coupling the deflector to the upper frame member, the lower frame member, the upper panel, and/or a vertical edge of the door may include coupling the deflector to the vertical edge of the door, such that the vertical edge of the door and the deflector overlap a vertical face of the enclosure, such as, for example, a vertical face of a door of the enclosure. In some examples, the enclosure may include first and second doors, and coupling the deflector to the upper frame member, the lower frame member, the upper panel, and/or a vertical edge of the door may include coupling the deflector to the vertical edge of the first door, such that when the first door and the second door are closed, the second door overlaps the deflector.

Although this subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

What is claimed is:

1. A deflector configured to reduce entry of at least one of dust or fluid into an enclosure configured to enclose in an interior thereof a plurality of optical communication connections, the deflector defining a longitudinal axis extending between a first end of the deflector and a second end of the deflector opposite the first end, the deflector comprising:
    an elongated first leg defining a first intersection edge and a first remote edge opposite the first intersection edge, the first leg defining a first hole adjacent the first end of the deflector and a second hole adjacent the second end of the deflector; and
    an elongated second leg defining a second intersection edge and a second remote edge opposite the second intersection edge,
    wherein the first intersection edge and the second intersection edge are coupled to one another to define a deflector angle, and
    wherein the first hole is configured to receive a first mounting stud associated with the enclosure, and the second hole is configured to receive a second mounting stud associated with the enclosure;
    wherein the first leg is coupled to an outward facing side of a horizontal frame member of the enclosure, such that the second leg extends in a direction away from a plane defined by the outward facing side of the horizontal frame member; and
    wherein the deflector angle is substantially perpendicular, and the deflector further comprises:
    a first flange extending from the first remote edge of the first leg in a direction substantially parallel to the second leg; and
    a second flange extending from a remote edge of the first flange in a direction substantially parallel to the first leg.

2. The deflector of claim 1, wherein the first leg is configured to be coupled to an underside of an upper panel of the enclosure such that the second leg extends in a direction away from a plane defined by the upper panel.

3. The deflector of claim 2, wherein the first leg defines a clearance recess extending from the first remote edge toward the first intersection edge.

4. The deflector of claim 2, wherein at least one of the first leg or the second leg defines an elongated slot extending in a direction substantially parallel to the longitudinal axis.

5. The deflector of claim 1, wherein the deflector angle is an acute angle.

6. The deflector of claim 1, wherein:
    the first leg further defines a third hole and a fourth hole adjacent the first hole, and a fifth hole and a sixth hole adjacent the second hole;
    the first hole and the second hole are spaced a first longitudinal distance from one another;
    the third hole and the fifth hole are spaced a second longitudinal distance from one another; and
    the fourth hole and the sixth hole are spaced a third longitudinal distance from one another; and
    wherein the first longitudinal distance, the second longitudinal distance, and the third longitudinal distance are substantially equal.

7. The deflector of claim 1, wherein:
    the first leg further defines a third hole and a fourth hole adjacent the first hole, and a fifth hole and a sixth hole adjacent the second hole;
    the first hole and the second hole are spaced a first edge distance from the first remote edge;
    the third hole and the fifth hole are spaced a second edge distance from the first remote edge;
    the fourth hole and the sixth hole are spaced a third edge distance from the first remote edge; and at least one of the first edge distance, the second edge distance, or the third edge distance differ from one another.

8. The deflector of claim 1, wherein the deflector angle is substantially perpendicular, and the deflector further comprises a flange extending from the second remote edge of the second leg in a direction substantially parallel to the first leg, and wherein the first leg is configured to be coupled to a vertical side edge of a door remote from a hinge supporting the door.

9. The deflector of claim 1, wherein the deflector is configured such that the first leg is configured to be coupled to a vertical edge of a door remote from a hinge supporting the door, and such that the first flange abuts a portion of the door.

10. An enclosure configured to enclose in an interior thereof a plurality of optical communication connections, the enclosure comprising:
an upper panel coupled to the enclosure and comprising a panel section and an upper flange extending orthogonal with respect to the panel section; and
an upper frame member configured to at least partially support the upper panel, the upper frame member defining a longitudinal axis extending between opposite ends of the upper frame member; and
a deflector configured to reduce entry of at least one of dust or fluid into the interior of the enclosure, the deflector defining a longitudinal axis extending between a first end of the deflector and a second end of the deflector opposite the first end, the deflector comprising:
an elongated first leg coupled to the upper frame member and defining a first intersection edge and a first remote edge opposite the first intersection edge; and
an elongated second leg defining a second intersection edge and a second remote edge opposite the second intersection edge,
wherein the first intersection edge and the second intersection edge are coupled to one another to define a deflector angle;
wherein the first leg is coupled to an underside of the upper panel of the enclosure, such that the second leg extends in a direction away from a plane defined by the upper panel and the second remote edge of the second leg abuts the upper flange of the upper panel.

11. The enclosure of claim 10, wherein the first leg is coupled to an outward facing side of the upper frame member of the enclosure, such that the longitudinal axis of the deflector is oblique with respect to the longitudinal axis of the upper frame member.

12. The enclosure of claim 10, wherein:
the deflector comprises a first deflector, and the enclosure further comprises a second deflector coupled to the upper frame member, the second deflector defining a second longitudinal axis;
the first leg of the first deflector is coupled to an outward facing side of the upper frame member of the enclosure, such that the longitudinal axis of the first deflector is oblique with respect to the longitudinal axis of the upper frame member; and
the second deflector is coupled to the outward facing side of the upper frame member of the enclosure, such that the second longitudinal axis of the second deflector is oblique with respect to at least one of the longitudinal axis of the first deflector or the longitudinal axis of the upper frame member.

13. An enclosure configured to enclose in an interior thereof a plurality of optical communication connections, the enclosure comprising:
a first vertical portion and a second vertical portion spaced from the first vertical portion, the first vertical portion and the second vertical portion partially defining an opening of the enclosure, and the second vertical portion comprising a vertical face facing outward relative to the enclosure; and
a door comprising:
a first vertical edge coupled to the first vertical portion of the enclosure, such that the door pivots relative to the first vertical portion; and
a second vertical edge opposite the first vertical edge, such that when the door pivots the second vertical edge of the door moves between a first position abutting the vertical face of the second vertical portion of the enclosure to a second position spaced from the vertical face; and
a deflector configured to reduce entry of at least one of dust or fluid into the interior of the enclosure, the deflector defining a longitudinal axis extending between a first end of the deflector and a second end of deflector opposite the first end, the deflector comprising:
an elongated first leg coupled to the vertical face of the enclosure and defining a first intersection edge and a first remote edge opposite the first intersection edge; and
an elongated second leg defining a second intersection edge and a second remote edge opposite the second intersection edge,
wherein the first intersection edge and the second intersection edge are coupled to one another to define a deflector angle, and
wherein the deflector further comprises a flange extending from at least one of the first remote edge of the first leg or the second remote edge of the second leg in a direction substantially parallel to the first leg.

14. The enclosure of claim 13, wherein:
the door comprises a first door, and the enclosure further comprises a second door comprising:
a third vertical edge coupled to a second vertical portion of the enclosure, such that the second door pivots relative to the second vertical portion; and
a fourth vertical edge opposite the third vertical edge, such that the fourth vertical edge of the second door moves between a first closed position at least partially overlapping the second vertical edge of the first door and an open position;
the second vertical edge of the first door defines a channel comprising opposing channel flanges coupled to one another via a web, the channel facing outward from the enclosure when the first door is in a closed position;
the deflector further comprises a first flange extending from the remote edge of the first leg in a direction substantially parallel to the second leg; and
the first leg of the deflector is coupled to the web, such that the second leg of the deflector abuts one of the channel flanges.

15. A method for reducing entry of at least one of dust or fluid into an enclosure configured to enclose in an interior thereof a plurality of optical communication connections, the method comprising:
coupling a deflector to one of an upper frame member, a lower frame member, an upper panel, or a vertical edge of a door of the enclosure, the deflector comprising:

an elongated first leg defining a first intersection edge and a first remote edge opposite the first intersection edge; and an elongated second leg defining a second intersection edge and a second remote edge opposite the second intersection edge, wherein the first intersection edge and the second intersection edge are coupled to one another to define a deflector angle, and wherein the first leg of the deflector is configured and coupled to the one of the upper frame member, the lower frame member, the upper panel, or the vertical edge of the door, such that at least one or more dust or fluid is substantially prevented from entering the interior of the enclosure;

wherein:
the door comprises a first door, and the enclosure further comprises a second door; and
coupling the deflector to the one of the upper frame member, the lower frame member, the upper panel, or a vertical edge of the door comprises coupling the deflector to the vertical edge of the first door, such that when the first door and the second door are closed, the second door overlaps the deflector.

16. The method of claim 15, wherein the coupling a deflector step comprises coupling a first deflector to the upper frame member, and the method further comprises at least one of:

coupling a second deflector to the lower frame member;
coupling a third deflector to the upper panel; or
coupling a fourth deflector to the vertical edge of the door.

17. The method of claim 15, wherein the coupling a deflector step comprises coupling the deflector to the upper frame member such that a longitudinal axis of the deflector is oblique with respect to a longitudinal axis of the upper frame member.

18. The method of claim 15, wherein coupling the first deflector to the upper frame member adjacent the first door and coupling the second deflector to the upper frame member adjacent the second door comprises coupling the first deflector and coupling the second deflector, such that a longitudinal axis of the second deflector is oblique with respect to at least one of a longitudinal axis of the first deflector or a longitudinal axis of the upper frame member.

19. The method of claim 15, wherein the coupling a deflector step comprises coupling the deflector to the vertical edge of the door, such that the vertical edge of the door and the deflector overlap a vertical face of the enclosure.

20. The method of claim 15, wherein:
the door comprises a first door, and the enclosure further comprises a second door;
the coupling the deflector step comprises coupling a first deflector to the upper frame member adjacent the first door; and the method further comprises coupling a second deflector to the upper frame member adjacent the second door.

* * * * *